(12) United States Patent
Choi et al.

(10) Patent No.: US 7,982,397 B2
(45) Date of Patent: Jul. 19, 2011

(54) ORGANIC ELECTROLUMINESCENCE DISPLAY DEVICE WITH MOISTURE ABSORBING MATERIAL

(75) Inventors: Dong-Soo Choi, Seoul (KR); Kwan-Hee Lee, Seoul (KR); Seung-Yong Song, Gyeonggi-do (KR)

(73) Assignee: Samsung Mobile Display Co., Ltd, Yongin (KR)

( * ) Notice: Subject to any disclaimer, the term of this patent is extended or adjusted under 35 U.S.C. 154(b) by 100 days.

(21) Appl. No.: 11/114,082

(22) Filed: Apr. 26, 2005

(65) Prior Publication Data
US 2005/0275348 A1    Dec. 15, 2005

(30) Foreign Application Priority Data

Apr. 27, 2004    (KR) .................. 10-2004-0029155

(51) Int. Cl.
*H01J 1/62*    (2006.01)
(52) U.S. Cl. .................................. 313/512; 313/506
(58) Field of Classification Search .................. 313/512, 313/506
See application file for complete search history.

(56) References Cited

U.S. PATENT DOCUMENTS

| 5,239,228 | A | * | 8/1993 | Taniguchi et al. | 313/512 |
| 5,962,962 | A | * | 10/1999 | Fujita et al. | 313/412 |
| 6,867,756 | B2 | * | 3/2005 | Park et al. | 345/76 |
| 7,473,928 | B1 | * | 1/2009 | Yamazaki et al. | 257/72 |
| 2001/0044035 | A1 | * | 11/2001 | Morii | 313/504 |
| 2002/0060654 | A1 | * | 5/2002 | Park et al. | 345/76 |
| 2002/0193035 | A1 | * | 12/2002 | Wei et al. | 445/22 |
| 2003/0122476 | A1 | * | 7/2003 | Wang et al. | 313/493 |
| 2003/0218422 | A1 | * | 11/2003 | Park et al. | 313/512 |
| 2004/0075115 | A1 | * | 4/2004 | Fery et al. | 257/200 |
| 2004/0201347 | A1 | * | 10/2004 | Park et al. | 313/512 |
| 2005/0264189 | A1 | * | 12/2005 | Choi et al. | 313/506 |

FOREIGN PATENT DOCUMENTS

| JP | 07-169567 | 7/1995 |
| JP | 2001-338755 | 12/2001 |
| KR | 10-2000-0060241 | 10/2000 |

\* cited by examiner

*Primary Examiner* — Peter Macchiarolo
(74) *Attorney, Agent, or Firm* — H.C. Park & Associates, PLC

(57) ABSTRACT

An organic electroluminescence display device comprising a light-emitting device formed on a lower insulating substrate, an upper substrate spaced apart from the lower insulating substrate, and a sealant between the lower insulating substrate and the upper substrate and covering the light-emitting device. The upper substrate comprises a moisture absorbing material.

17 Claims, 4 Drawing Sheets

ORGANIC ELECTROLUMINESCENCE DISPLAY DEVICE WITH MOISTURE ABSORBING MATERIAL

CROSS REFERENCE TO RELATED APPLICATION

This application claims priority to and the benefit of Korean Patent Application No. 10-2004-0029155, filed on Apr. 27, 2004, which is hereby incorporated by reference for all purposes as if fully set forth herein.

BACKGROUND OF THE INVENTION

1. Field of the invention

The present invention relates to an organic electroluminescence (EL) display device, more particularly, to an organic EL display device comprising a sealant covering an organic light-emitting device and a moisture absorbing material formed on an upper substrate.

2. Description of Related Art

Generally, in an organic EL display device, electrons and holes are injected into an emitting layer from a cathode and an anode, respectively. The electrons and holes recombine in the emitting layer to form excitons, which emit light when they transition from an excited state to a ground state.

Since the organic EL display device is self emissive, unlike a liquid crystal display device, it does not require a separate light source. Therefore, it may be made thin and light-weight.

The organic EL display device may be a passive matrix (PM) type or an active matrix (AM) type according to its driving method.

Although the PM type organic EL display device may be simply fabricated, it consumes a lot of power, it is not easily formed as a large screen device, and as the number of wirings increases, its opening ratio decreases.

Therefore, the PM type organic EL display device may be used for small sized display devices, while the AM type may be used for a display device having large area.

However, a conventional organic EL display device may degrade since an organic light-emitting layer material and a cathode electrode material typically have low moisture and oxidation resistance, which may result in a non-emitting region (i.e. dark spot). Over time, the dark spot may spread to the point where the device no longer emits any light at all.

Therefore, in order to solve the foregoing problems, the organic EL display device may be encapsulated to prevent exposure to moisture and oxygen. Encapsulation typically entails bonding a lower insulating substrate to an upper substrate by means of a sealant.

The foregoing encapsulation technology includes a method for coating a sealant on the outer circumference of a region at which a light-emitting device is formed, and then bonding the light-emitting device to the encapsulation substrate by means of the sealant. However, the sealant's limited width constrains its ability to prevent infiltration of external moisture or oxygen.

Japanese Patent Publication No. 2001-338755 discloses an organic EL display device having a sealant comprising a first sealant and a second sealant coated on the front surface of a region at which the light-emitting device is formed, as illustrated in FIG. 1.

Referring to FIG. 1, an organic light-emitting device 110, which may comprise an organic emitting layer between an anode electrode and a cathode electrode, is formed on an insulating substrate 100, and the light-emitting device 110 is encapsulated with an encapsulation substrate 120 using a sealant 130 having a two layer structure of a first sealant 131 and a second sealant 135.

The first sealant 131 may be formed of a halide, an alkali metal or an alkaline earth metal, and the second sealant 135 may be formed of moistureproof material.

However, in such an organic EL display device, since the first sealant 131 contacts the organic light-emitting device, it may degrade the organic light-emitting device 110.

SUMMARY OF THE INVENTION

The present invention provides an organic EL display device comprising a sealant for covering an organic light-emitting device and a moisture absorbing material formed on an upper substrate.

Additional features of the invention will be set forth in the description which follows, and in part will be apparent from the description, or may be learned by practice of the invention.

The present invention discloses an organic EL display device comprising a light-emitting device formed on a first substrate, a second substrate spaced apart from the first substrate, and a sealant between the first substrate and the second substrate and covering the light-emitting device. The second substrate comprises a moisture absorbing material.

The present invention also discloses a method for fabricating an organic EL display device comprising forming a light-emitting device on a first substrate, forming a moisture absorbing material on a second substrate, coating a sealant on a region of the second substrate corresponding to the light-emitting device, and bonding the first substrate with the second substrate such that the sealant covers the light-emitting device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
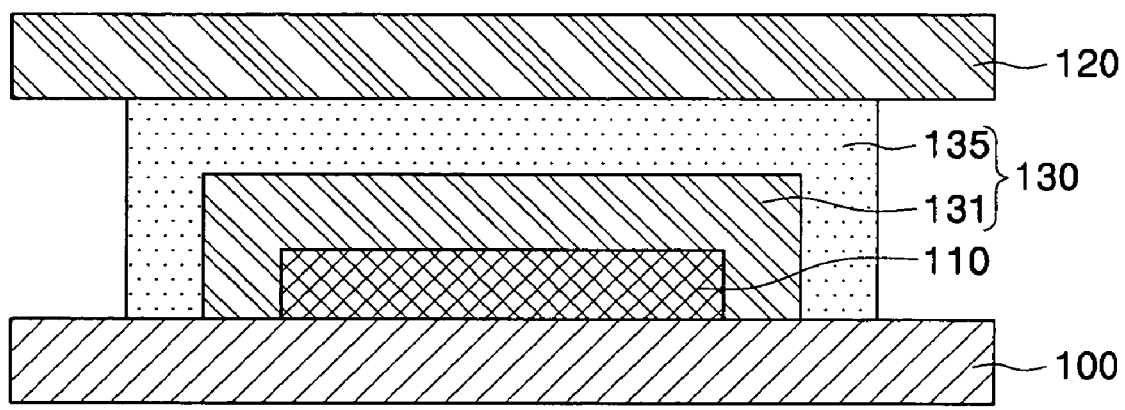
FIG. 1 is a drawing for explaining a conventional organic EL display device.

Embodiments of the present invention will now be described in detail with reference to the accompanying drawings. For reference, like reference characters designate corresponding parts throughout several views.

Figure 2A:
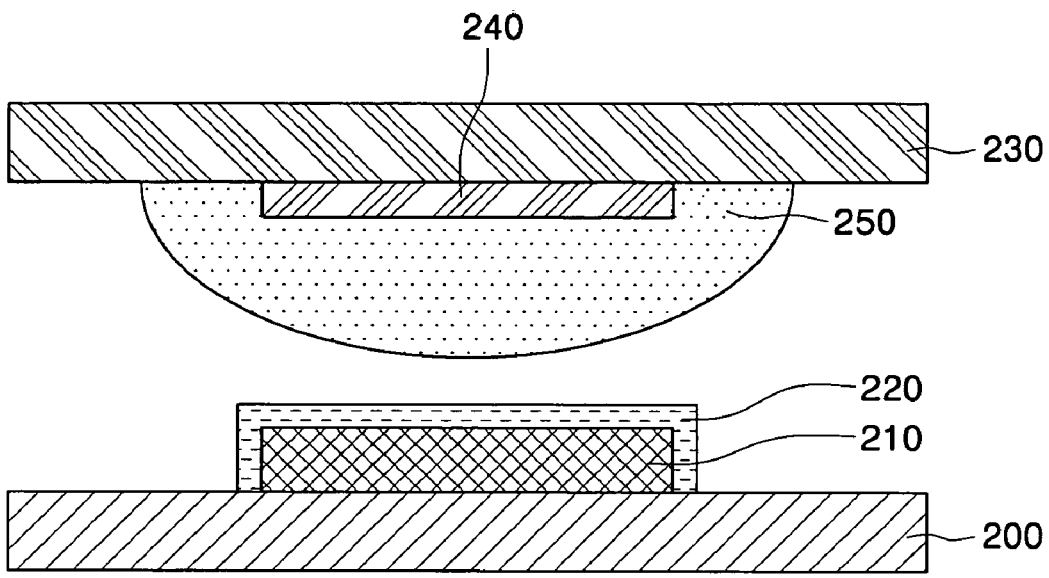
FIG. 2A and FIG. 2B are process cross sectional views showing an organic EL display device according to an exemplary embodiment of the present invention.
Figure 2B:
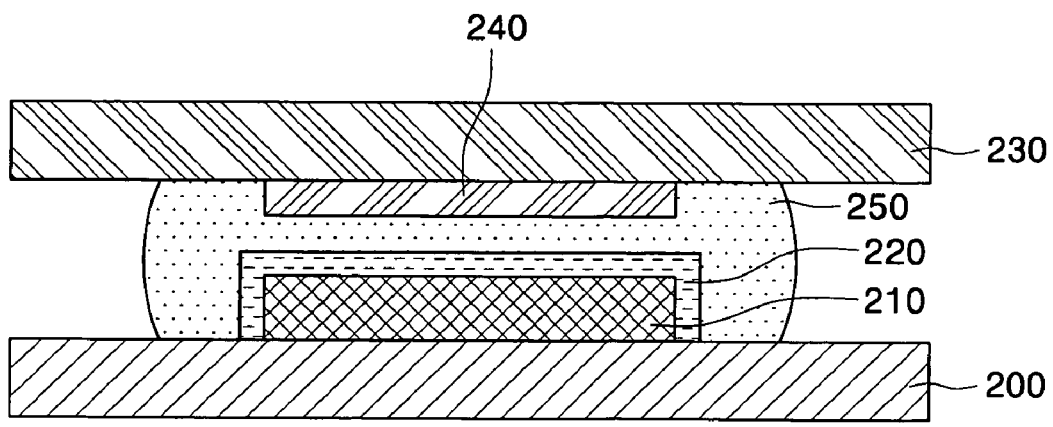

FIG. 2A and FIG. 2B are process cross sectional views showing an organic EL display device according to an exemplary embodiment of the present invention.

Referring to FIG. 2A and FIG. 2B, an organic EL display device may include a lower insulating substrate 200, an organic light-emitting device 210 formed on the lower insulating substrate 200, an upper substrate 230 spaced apart from the organic light-emitting device 210 and having a moisture absorbing material 240, and a sealant 250 formed in a space between the lower insulating substrate 200 and the upper substrate 230.

Referring to FIG. 2A, the organic light-emitting device 210 may be formed on the lower insulating substrate 200.

The organic light-emitting device 210 may comprise a first electrode, an organic light-emitting layer and a second electrode. The second electrode acts as a cathode electrode when the first electrode acts as an anode electrode, and the second electrode acts as the anode electrode when the first electrode acts as the cathode electrode.

Furthermore, the organic light-emitting layer may comprise various layers according to its function, and it may have a multilayer structure comprising an emitting layer and at least one of the following layers: a hole injection layer (HIL), hole transport layer (HTL), hole blocking layer (HBL), electron transport layer (ETL) and electron injection layer (EIL).

If the organic light-emitting device 210 is a bottom-emission type device, the first electrode may be formed of a transparent conductive material, such as indium tin oxide (ITO) and indium zinc oxide (IZO), and the second electrode may be formed of a metal having superior reflectivity.

On the other hand, if the organic light-emitting device 210 is a top-emission type device, the first electrode may have a structure comprising a reflection film, such as, for example, a reflection film and transparent electrode formed on the reflection film. The second electrode may have a structure with an optical transmittance property, such as, for example, a thin metal film having an optical transmittance property and a transparent electrode formed on the thin metal film.

After forming the organic light-emitting device 210, a passivation layer 220 may be formed to cover the organic light-emitting device 210. The passivation layer 220 may be an organic film, an inorganic film or a composite film thereof, and it protects the organic light-emitting device 210 from external physical and chemical stimuli.

An upper substrate 230 having a moisture absorbing material 240 may be prepared as an encapsulation substrate.

The moisture absorbing material 240 may be formed of an alkali metal oxide or an alkaline earth metal oxide, such as, for example, an oxide of Ca or Ba. Furthermore, the moisture absorbing material 240 may be formed through a thermal evaporation, ebeam, sputtering or coating process.

If the organic light-emitting device 210 is a top-emission type device, the moisture absorbing material 240 may be formed of a material that transmits light. The moisture absorbing material 240 may be formed to have an optical transmittance property by evaporating the alkali metal oxide or alkaline earth metal oxide to a thickness of about 100 μm or less.

After forming the moisture absorbing material 240, a sealant 250 may be coated on a region of the upper substrate 230 corresponding to the organic light-emitting device 210. The sealant 250 may comprise a transparent, moistureproof material if the organic light-emitting device 210 is a top-emission type device.

The sealant 250 may be formed of a thermosetting or photocurable material, such as, for example, an epoxy based, acryl based, imide based or silane based material.

Furthermore, the sealant 250 may be formed of a material having a vapor permeability of 100 g/m² ·day or less.

The sealant 250 may be formed of a material having 30% or less volume shrinkage during curing in order to minimize the influence exerted on the organic light-emitting device 210 by the sealant 250 since the sealant 250 may shrink during thermosetting or photocuring.

Referring to FIG. 2B, after coating the sealant 250 on the upper substrate 230, the upper substrate 230 is arranged so that the sealant 250 faces the lower insulating substrate 200. The lower insulating substrate and the upper substrate may be encapsulated by pressing the lower insulating substrate 200 and the upper substrate 230 together, thereby bonding the lower insulating substrate 200 and the upper substrate 230 by means of the sealant 250 and burying the organic light-emitting device 210 in the sealant 250.

The sealant 250 may be cured by irradiating heat or light onto the sealant 250.

Figure 3A:
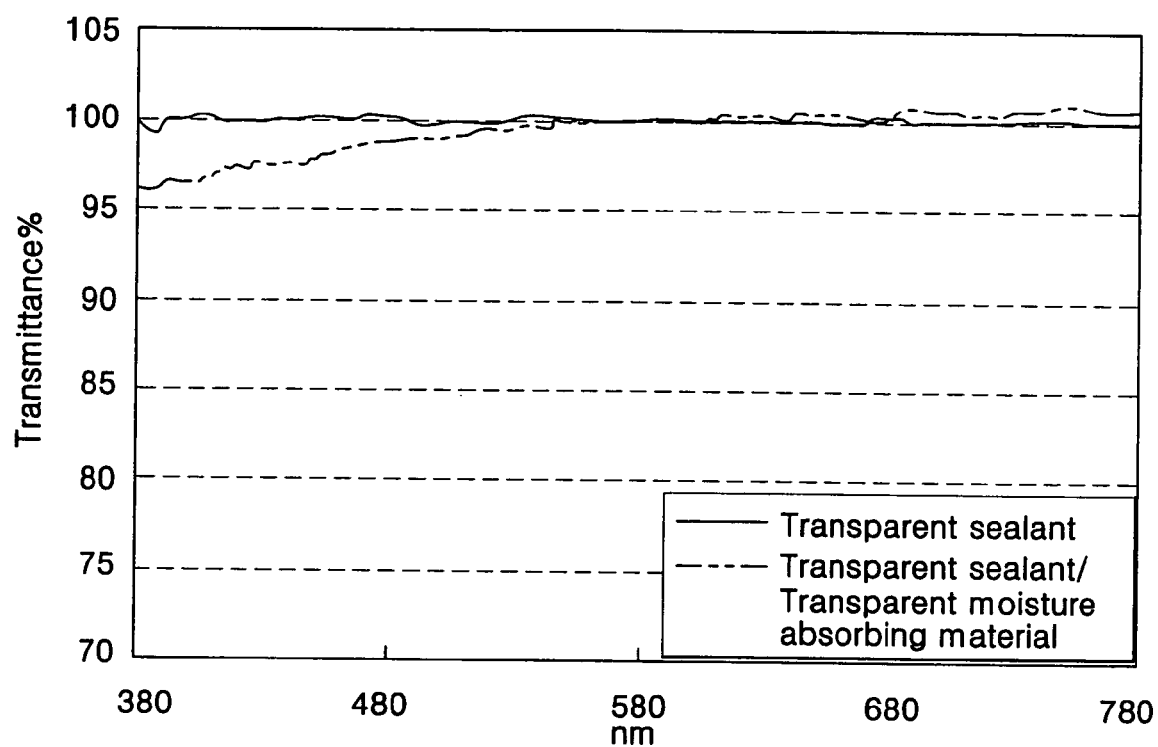
FIG. 3A is a drawing for explaining front directional optical transmittance of an organic EL display device according to an exemplary embodiment of the present invention.
Figure 3B:
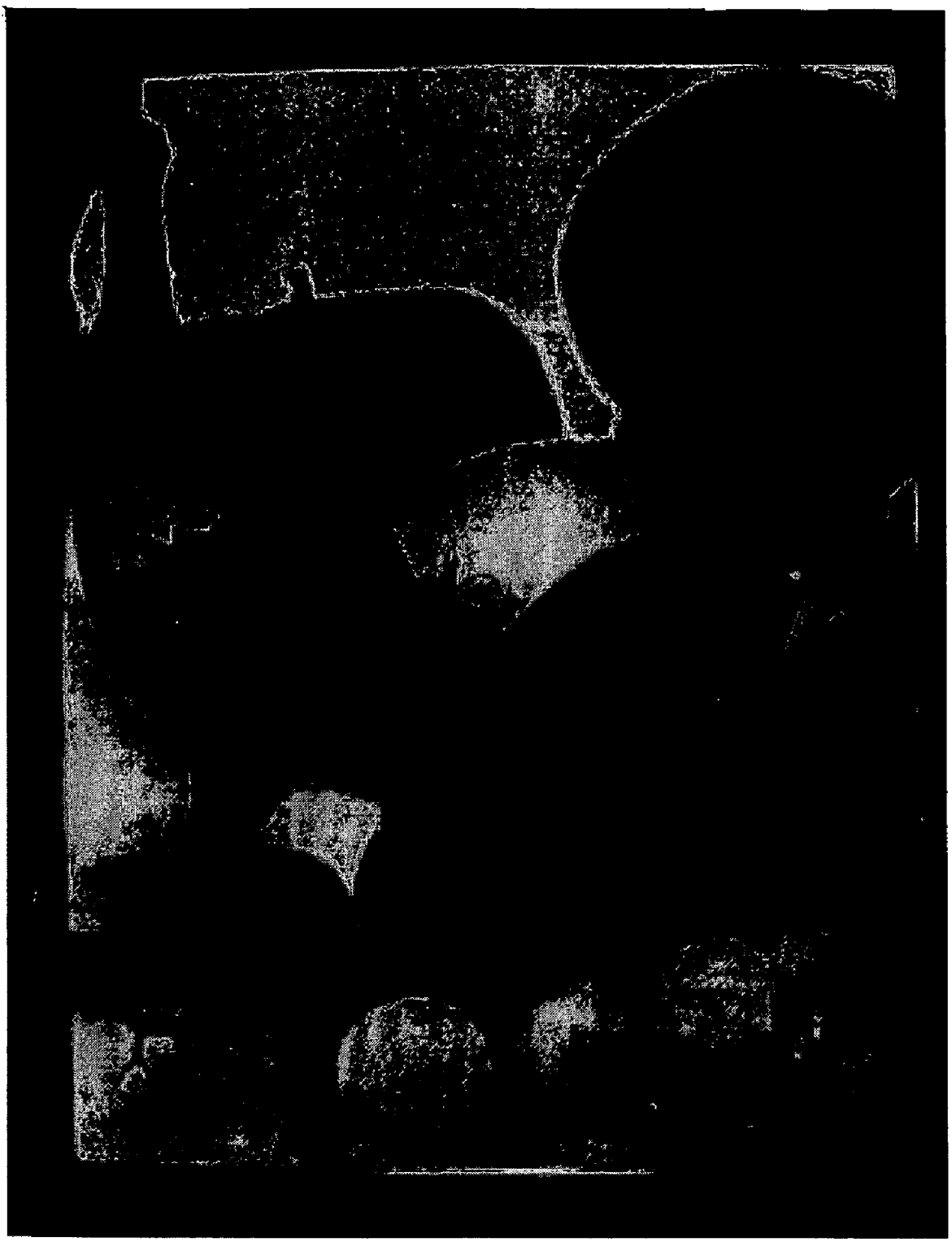
FIG. 3B is a drawing showing an image of a top-emission type organic EL display device according to an exemplary embodiment of the present invention.

FIG. 3A is a drawing for explaining front directional optical transmittance of an organic EL display device according to an exemplary embodiment of the present invention, and FIG. 3B shows an image of a top-emission type organic EL display device according to an exemplary embodiment of the present invention.

Referring to FIG. 3A and FIG. 3B, it can be seen that front directional optical transmittance of an organic EL display device using the transparent sealant and the moisture absorbing material having an optical transmittance property is at least 95% of that of an organic EL display device using a transparent sealant only. In other words, using the transparent sealant and the moisture absorbing material having an optical transmittance property does not significantly deteriorate the image quality of a top-emission type organic EL display device.

The foregoing organic EL display device may improve moisture proofing and moisture absorbing characteristics by forming the sealant 250 covering the organic light-emitting device 210 and forming a moisture absorbing material 240 on the upper substrate 230.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescence (EL) display device, comprising:
   a light-emitting device on a first substrate;
   a second substrate spaced apart from the first substrate; and
   a sealant between the first substrate and the second substrate and completely covering the light-emitting device,
   wherein a moisture absorbing layer is formed on the second substrate, the moisture absorbing layer disposed between the sealant and the second substrate, and directly contacts the sealant,
   wherein only the sealant contacts both the first substrate and the second substrate, and
   wherein light emitted from the light-emitting device transmits through the moisture absorbing layer.

2. The organic EL display device of claim 1, wherein the moisture absorbing layer comprises an alkali metal oxide or an alkaline earth metal oxide.

3. The organic EL display device of claim 2, wherein the alkaline earth metal oxide is an oxide of Ca or Ba.

4. The organic EL display device of claim 2, wherein the moisture absorbing layer is about 100 μm or less thick.

5. The organic EL display device of claim 1, wherein the sealant comprises a transparent, moistureproof material.

6. The organic EL display device of claim 1, wherein the sealant comprises a thermosetting material or a photocurable material.

7. The organic EL display device of claim 6, wherein the sealant comprises an epoxy based, acryl based, imide based or silane based material.

8. The organic EL display device of claim 1, wherein the sealant comprises a material having a vapor permeability of 100 g/m$^2$·day or less.

9. The organic EL display device of claim 1, wherein the sealant is formed of a material having 30% or less volume shrinkage during curing.

10. The organic EL display device of claim 1, further comprising a passivation layer covering the organic light-emitting device, wherein the passivation layer is between the organic light-emitting device and the sealant.

11. The organic EL display device of claim 10, wherein the moisture absorbing layer is spaced apart from the passivation layer.

12. The organic EL display device of claim 10, wherein the sealant is arranged between the passivation layer and the moisture absorbing layer.

13. The organic EL display device of claim 1, wherein the moisture absorbing layer is formed on a surface of the second substrate facing the first substrate.

14. The organic EL display device of claim 13, wherein the sealant covers the moisture absorbing layer.

15. The organic EL display device of claim 1, wherein the moisture absorbing layer contacts the second substrate and the sealant.

16. The organic EL display device of claim 1, further comprising a passivation layer covering the organic light-emitting device, wherein the sealant contacts the first substrate, the second substrate, the passivation layer, and the moisture absorbing layer.

17. The organic EL display device of claim 1, wherein the moisture absorbing layer contacts a first portion of the second substrate, and the sealant contacts the moisture absorbing layer and a second portion of the second substrate disposed outside the first portion, but the sealant does not contact the first portion.

* * * * *